United States Patent [19]

Payne

[11] 4,013,902
[45] Mar. 22, 1977

[54] INITIAL RESET SIGNAL GENERATOR AND LOW VOLTAGE DETECTOR

[75] Inventor: Robert L. Payne, Crystal, Minn.
[73] Assignee: Honeywell Inc., Minneapolis, Minn.
[22] Filed: Aug. 6, 1975
[21] Appl. No.: 602,171
[52] U.S. Cl. .......................... 307/268; 307/235 W; 307/251; 307/279; 328/48
[51] Int. Cl.² ................. H03K 21/32; H03K 17/20; H03K 17/30; H03K 17/60
[58] Field of Search ..... 307/251, 268, 279, 235 W, 307/296 R, 296 A, 310; 328/48

[56] References Cited
UNITED STATES PATENTS

| | | | |
|---|---|---|---|
| 3,401,319 | 9/1968 | Watkins | 307/279 X |
| 3,416,008 | 12/1968 | Memelink et al. | 307/279 |
| 3,504,196 | 3/1970 | Thompson | 307/235 W X |
| 3,582,677 | 6/1971 | Perkins | 307/279 X |
| 3,749,944 | 7/1973 | Luebrecht | 307/204 X |
| 3,753,011 | 8/1973 | Faggin | 307/279 X |
| 3,892,985 | 7/1975 | Kawagoe | 307/279 |
| 3,895,239 | 7/1975 | Alaspa | 328/48 X |
| 3,895,240 | 7/1975 | Kawagoe | 307/279 |

OTHER PUBLICATIONS

Hanchett, "Turn-On Reset Pulse Circuits," RCA Technical Notes; 4 pages, Mar. 28, 1973.

*Primary Examiner*—John S. Heyman
*Assistant Examiner*—Larry N. Anagnos
*Attorney, Agent, or Firm*—Albin Medved

[57] ABSTRACT

A circuit for generating an initial reset signal for a custom design CMOS digital system and for providing a diagnostic low voltage detect signal when the power supply voltage drops below a predetermined level. The circuit is fabricated with CMOS technology in conjunction with two external resistors and a diode.

7 Claims, 1 Drawing Figure

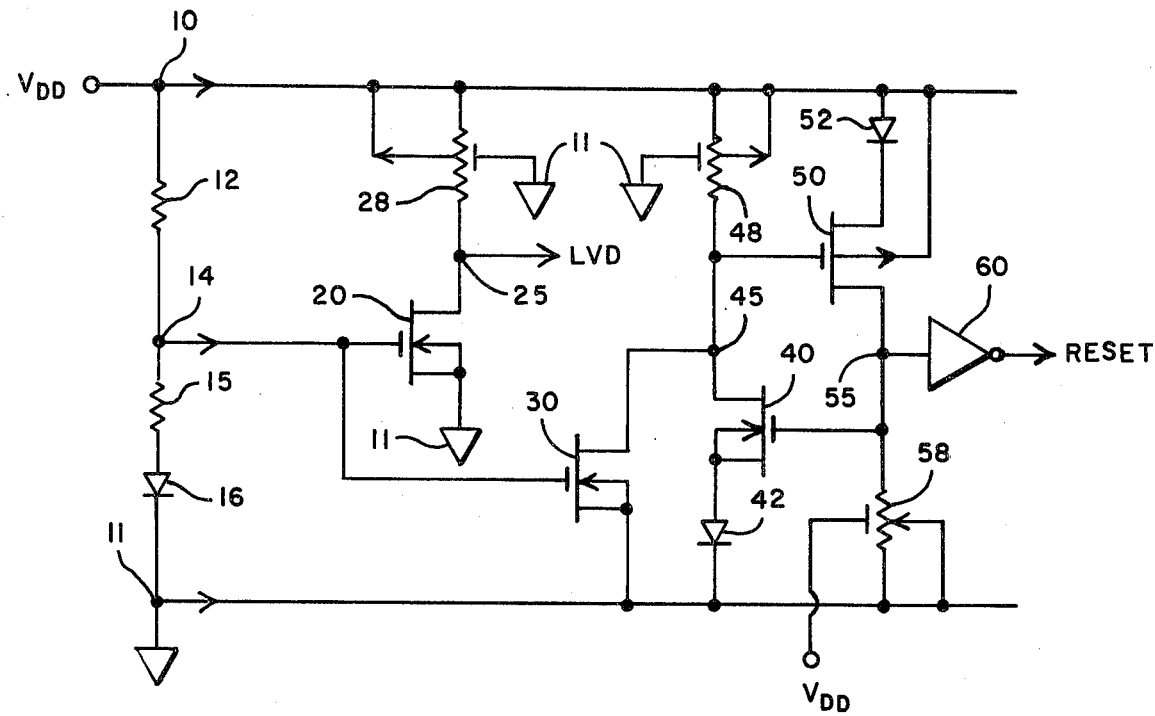

INITIAL RESET SIGNAL GENERATOR AND LOW VOLTAGE DETECTOR

BACKGROUND OF THE INVENTION

1. Field of the Invention

The present invention relates to circuits for generating a reset signal for a digital system upon application of power to such system. Additionally, the present invention relates to circuits for detecting low voltage condition of a power supply and to provide a signal when such low voltage condition occurs. In particular, the present invention is intended for use with custom designed logic circuits utilizing complementary symmetry metal oxide semiconductor technology (CMOS).

2. Prior Art

Means for generating a reset signal in prior art have often been in the form of circuits external to the chip or substrate on which the digital system requiring the reset signal was fabricated. For cost effective design of CMOS chips it is desirable to limit the numbers of leads or pins for external connections to as few as possible. It is, therefore, desirable to incorporate the circuit for generating the initial reset signal on the chip or substrate on which the digital systems are fabricated.

In other designs, where the circuit for generating a reset signal upon application of power was incorporated as part of the integrated circuit design, the reliability of the circuits left something to be desired because the power reset latch in many cases was assuming a wrong initial state.

In addition to the generation of a reset signal, the circuit according to the present invention provides low voltage detection. In the prior art substantial difficulty was encountered in attempts to provide reliable low voltage detection means which was not affected substantially by temperature variations. Primarily the difficulty with the prior art designs was that the signal indicative of the power supply voltage level was applied to the drain of a CMOS device and as a result was drawing large current. In the present invention the input is applied to the gate, thus avoiding influence of the wide current fluctuations with changes in temperature.

SUMMARY OF THE INVENTION

The present invention is intended for use in custom designed CMOS digital systems. It is particularly useful where battery operated equipment is used and low battery voltage detection is desired, as well as a means for generating an initial reset signal upon the application of power. The low current requirements of the CMOS design offer many advantages. In addition to the conservation of power, the low current allows for more stable temperature compensation over a wide range of temperatures.

The circuit includes a bistable power sensing latch comprised of two current paths each including an FET transistor and a resistor connected in a bridge formation between the two input power terminals and a pair of junction nodes. Upon application of electric power to the custom circuit, the power sensing latch assumes a first state in which a high potential exists at the reset node. For proper operation of the circuit, it is essential that the power sensing latch always assume the same initial state immediately after power is applied to the circuit. Since the resistors constructed on a CMOS chip will not conduct until a threshold voltage is exceeded, it is possible that the transistors in the power latch circuit may go into conduction before the resistors. This would result in the power sensing latch assuming the wrong initial state and would result in the failure of the circuit to generate the initial reset signal. To prevent the transistors from turning on prematurely, diodes are connected in series with the source of each of the two FET transistors in the power sensing latch, as shown in the drawing. The initial reset signal is removed when the power supply reaches a predetermined level set by the two external resistors and diode. At this point the power sensing latch switches to an alternate state where it will remain until power is reapplied to the circuit.

The low voltage detection is accomplished by applying a ratio of the power supply voltage to the gate of a FET transistor. The FET transistor will normally conduct, while the potential of the power supply is above a predetermined level set by the voltage divider and diode. As the potential drops below this predetermined level, the conduction of the FET transistor is interrupted, thereby generating a low voltage detection signal. By applying the voltage signal to the gate of the FET transistor, as opposed to one of the other electrodes, the variations in the current due to temperature changes do not have as much effect on the operation of the low voltage detection circuit. This makes better temperature compensation possible.

According to the present invention, the initial reset signal and the low voltage detection functions are provided by a circuit which is a part of the integrated chip or substrate on which the digital system is constructed with the requirement of only one additional pin for external connection.

It is therefore an object of the present invention to provide a circuit for generating an initial reset signal for use in a CMOS digital system. A further object of the present invention is to provide a circuit for detecting the low voltage condition of a power supply connected to a CMOS digital system. More particularly, it is the object of the present invention to provide a circuit for generating an initial reset signal and for detecting a low voltage condition in a CMOS digital system, which circuit is incorporated on the integrated chip or substrate on which the digital system is constructed and which circuit requires low current consumption and whose operation is stable over a wide range of temperatures.

DESCRIPTION OF THE PREFERRED EMBODIMENT

The circuit in the drawing represents a preferred embodiment of the present invention. With the exception of two external resistors and a diode, the circuit is constructed on a CMOS chip. The threshold voltage ($V_T$) of a transistor on a CMOS chip has a definite, relatively well-defined value. The high-input impedance property of such a transistor makes possible a very compact design which consumes smaller amounts of power.

The transistors used in the present circuit have first and second electrodes, referred to as the source and drain and defining the ends of a conduction path. The transistors formed have a control electrode, also commonly referred to as the gate, whose applied potential determines the conductivity of the conduction path. For a P-type, the source electrode has a potential applied to it which is higher than the potential on the drain electrode. For an N-type, the source electrode has the lower potential applied to it than the potential on the drain electrode. The transistors of this type are bi-directional in the sense that the current can flow in either direction, depending upon the potentials on the gate and the source electrodes. Conduction will occur in the transistor when the potential in between the gate and the source electrodes is in the direction of the current flow through the transistor and exceeding the threshold voltage ($V_T$).

Referring to the FIGURE of the drawing, an input terminal 10 is connected to a power source of positive potential, while a terminal 11 is connected to a reference potential or ground. A resistor 12 has one end connected to the positive potential terminal 10 and is connected at its other end to a junction node 14. A second resistor 15 is connected between junction node 14 and the anode of a temperature compensating diode 16, whose cathode is connected to ground terminal 11. Resistors 12 and 15 act as a voltage divider, producing at junction point 14 a potential which is proportional to the power source voltage $V_{DD}$. Resistors 12 and 15 and diode 16 are external to the CMOS chip, which includes the remaining circuitry shown in the drawing. Terminals 10 and 11 and junction point 14 represent pins on the CMOS chip, for connecting the chip to external circuitry.

An N-channel FET transistor 20 has its gate electrode connected to junction point 14, its source electrode connected to the reference potential terminal 11, and its drain terminal connected to a low voltage detection (LVD) terminal 25. A resistor 28 is connected between LVD terminal 25 and positive potential terminal 10. Resistor 28, and the other resistors on the chip, are, in fact, FET transistors connected to function as resistors by connecting the gate and the source of the transistors between positive potential terminal 10 and reference potential terminal 11. Resistor 28 is formed from a P-channel field effect transistor and is designed to provide an impedance in the order of one megaohm.

A second N-channel field effect transistor 30 has its gate electrode connected directly to junction point 14, its source electrode connected to ground terminal 11 and its drain electrode connected to a junction node 45 and to the drain electrode of an N-channel field effect transistor 40. Transistor 40 has its source electrode connected to the anode of a diode 42, whose cathode is in turn connected to ground terminal 11. The drain of transistor 40 is further connected to the gate of a P-channel field effect transistor 50 and also to one end of a resistor 48, whose other end is connected to the positive potential terminal 10. Resistor 48 is formed from a P-channel field effect transistor, whose gate is connected to reference potential terminal 11 and whose source is connected to the positive potential terminal 10. The impedance of resistor 48 is in the range of 1 megaohm.

The gate electrode of transistor 40 is connected directly to the drain electrode of transistor 50 and to a junction node 55, as well as to ground terminal 11 through a resistor 58. Resistor 58 is an N-channel field effect transistor whose source is connected to reference potential terminal 11 and whose gate is connected to positive potential terminal 10. Likewise, as resistors 28 and 48, resistor 58 has an impedance in the range of 1 megaohm.

A diode 52 is connected between the source of transistor 50 and the positive potential terminal 10, diode 52 being oriented for easy forward current flow from terminal 10 to the source of transistor 50.

Junction 55 is connected to the input of an inverting buffer 60, at the output of which will appear a reset signal when generated by the circuit. Upon application of power between terminals 10 and 11, FET resistor 28, 48, and 58 will all turn on since the full power supply is applied between the source and the gate. At junction point 14, the voltage will rise to a level which will be adequate to turn on N-channel field effect transistors 20 and 30. The conduction of transistor 20 will essentially result in a short circuit between LVD terminal 25 and ground potential terminal 11, thereby maintaining terminal 25 at a low potential. The potential at terminal 25 will remain at a low so long as the supply voltage is adequate to maintain the required gate to source potential on transistor 20. Should the source potential drop below the predetermined value, transistor 20 will shut off, raising the voltage at LVD terminal 25, thereby generating a signal indicative of the low voltage condition. The threshold, at which the low voltage condition is indicated, is determined by the relative values of resistors 12 and 15 in the voltage divider circuit between the power supply terminals. The function of diode 16, as mentioned before, is to provide temperature compensation.

As the power is applied to input terminals 10 and 11, junction node 45 between resistor 48 and transistor 40 will be at a high potential because resistor 48 is conducting while transistor 40 is turned off. At the same time, junction node 55 between resistor 58 and transistor 50 is at a low potential, since resistor 58 is conducting and transistor 50 is turned off. Diodes 42 and 52 connected in the source electrode path of transistors 40 and 50, respectively, assure that, when the power is applied, resistors 48 and 58 conduct, while transistors 40 and 50 are maintained non-conducting. Thus, upon application of voltage at input terminals 10 and 11, junction node 55 will be at a low potential. Through the action of the buffer inverter 60, a high potential signal will appear at the output of inverter 60, this high potential signal representing an initial reset signal for the custom CMOS digital system (not shown) with which the circuit of the present invention is to be used.

As the potential at junction 14 rises to a level which is high enough to turn on transistors 20 and 30, junction node 45 will be pulled down to the low potential level of reference potential terminal 11 through the conductive path provided by transistor 30. As the voltage at junction point 45 is lowered, transistor 50 will be rendered conductive, thereby raising the voltage at junction node 55 and the input of the inverting buffer 60, removing the reset signal appearing at the output of buffer 60. The higher voltage appearing at junction node 55 will result in conduction of transistor 40, thereby assuring that the potential at junction node 45 will remain at a low potential even when transistor 30 ceases to conduct. As can be seen from the foregoing discussion, transistors 40 and 50, resistors 48 and 58, and diodes 42 and 52, comprise a latching circuit which is set and reset by the initial application of the voltage to the input terminals 10 and 11.

Should, during the operation of the system, the voltage of the power supply drop below a predetermined level, transistors 20 and 30 will turn off. This will result in a low voltage detection signal appearing at terminal 25, as explained previously. The turning off of transistor 30, however, will not alter the state of the latch circuit and therefore will not result in the appearance of a reset signal at the output of buffer 60. Only if the power is removed totally or if the voltage drops below the level at which transistors 40 and 50 can be maintained in conduction (approximately 2.5 volts) will a reset signal appear at the output of inverter 60 upon restoration of power.

What is claimed is:

1. An apparatus for generating a power up initial reset signal, said apparatus comprising:
   first and second input terminals for connection to a source of electric potential;
   a first current path between said first and second input terminals formed by a first resistor connected between said first input terminal and a first junction node and a first MOS field effect transistor of a first channel polarity having its drain connected to said first junction node and having its source connected through a first diode to said second input terminal;
   a second current path between said first and second input terminals formed by a second resistor connected between said second input terminal and a second junction node and a second MOS field effect transistor of a second channel polarity having its drain connected to said second junction node and having its source connected through a second diode to said first input terminal;
   means connecting the gate of said first field effect transistor to said second junction node;
   means connecting the gate of said second field effect transistor to said first junction node; and
   a third MOS field effect transistor of a first channel polarity having its drain connected to said first junction node, its source connected to said second input terminal, and its gate connected through an impedance to said first input terminal, whereby upon application of a voltage signal between said first and second input terminals, the voltage appearing at said second node in said second current path is first near the potential of said second input terminal, but upon conduction of said third field effect transistor is switched so as to be near the potential of said first input terminal.

2. Apparatus according to claim 1, wherein said first and third transistors are N-channel MOS field effect transistors and said second transistor is a P-channel MOS field effect transistor.

3. Apparatus according to claim 1 wherein a buffer is provided having its input connected to said second junction node to provide at its output a reset signal which is a function of the voltage at said second junction node.

4. Apparatus according to claim 3 wherein said first resistor is a P-channel MOS field effect transistor having its source connected to said first input terminal, its drain connected to said first junction node, and its gate connected to said second input terminal and wherein said second resistor is an N-channel MOS field effect transistor having its source connected to said second input terminal, its drain connected to said second junction node, and its gate connected to said first input terminal.

5. Apparatus according to claim 3 wherein said buffer is an inverter.

6. Apparatus according to claim 1 having the additional feature of providing low voltage detection, said additional feature comprising:
   a third resistor connected between said first input terminal and a low voltage detection output terminal; and
   a fourth MOS field effect transistor of a first channel polarity having its drain connected to said low voltage detection output terminal, its source connected to said second input terminal, and its gate connected, through a voltage divider, to said first input terminal, whereby under normal operating conditions while the power supply voltage applied between said first and second input terminals is of sufficient amplitude, the potential at said low voltage detection output terminal will be approximately equal to the potential of said second input terminal, while upon decrease of said power supply voltage below a predetermined level, the potential at said low voltage detection output terminal will be approximately equal to the potential of said first input terminal.

7. Apparatus according to claim 6 wherein said third resistor is a MOS transistor of a second channel polarity having its source connected to said first input terminal, its drain connected to said low voltage detection output terminal and its gate connected to said second input terminal.

* * * * *